United States Patent [19]
Molin

[11] Patent Number: 5,631,593
[45] Date of Patent: May 20, 1997

[54] ADJUSTABLE DELAY LINE

[75] Inventor: Stuart B. Molin, Oceanside, Calif.

[73] Assignee: Brooktree Corporation, San Diego, Calif.

[21] Appl. No.: 670,397

[22] Filed: Jun. 25, 1996

Related U.S. Application Data

[63] Continuation of Ser. No. 382,677, Feb. 2, 1995, Pat. No. 5,554,950, which is a continuation of Ser. No. 11,205, Jan. 29, 1993, abandoned, which is a continuation-in-part of Ser. No. 830,595, Feb. 4, 1992, abandoned.

[51] Int. Cl.⁶ .................................................. H03H 11/26
[52] U.S. Cl. ........................... 327/277; 327/276; 327/284
[58] Field of Search .................................. 327/265, 276, 327/277, 278, 284, 285, 264

[56] References Cited

U.S. PATENT DOCUMENTS

| | | | |
|---|---|---|---|
| 4,200,810 | 4/1980 | Cain et al. | 327/263 |
| 4,797,585 | 1/1989 | Segawa et al. | 327/261 |
| 4,797,586 | 1/1989 | Traa | 327/277 |
| 4,820,944 | 4/1989 | Herlein et al. | 327/274 |
| 4,862,020 | 8/1989 | Cowan et al. | 327/278 |
| 5,111,975 | 5/1992 | Hillis et al. | 327/244 |
| 5,144,174 | 9/1992 | Murakami | 327/277 |
| 5,192,886 | 3/1993 | Wetlaufer | 327/277 |
| 5,210,450 | 5/1993 | Parkinson | 327/269 |

FOREIGN PATENT DOCUMENTS 3-82214  4/1991  Japan.

Primary Examiner—Terry Cunningham
Attorney, Agent, or Firm—Ellsworth R. Roston; Charles H. Schwartz

[57] ABSTRACT

A plurality of binary signals each having first and second logic levels respectively representing a binary "1" and a binary "0" and each indicating a binary digit of an individual binary significance cumulatively represent an adjustable delay to be provided by a plurality of delay elements. A first particular number of the binary signals of greatest binary significance are decoded to provide, in a thermometer code, a plurality of signals each having first and second amplitudes. The signals in the thermometer code control the operation of individual switches each having first and second operative relationships to provide respectively for a maximum delay or a minimum delay in an associated one of the delay elements. The binary signals of least binary significance are decoded to produce an analog signal variable between the first and second amplitudes. The analog signal is introduced, in a third operative relationship of an individual one of the switches, to the delay element associated with such switch to provide a delay variable between the minimum and maximum values in accordance with the amplitude of the analog signal. The selection of the individual one of the switches is dependent upon the pattern of the binary signals in the thermometer code, this pattern being a binary 10 in a successive pair of the decoded binary signals. The delay elements may be connected in series to provide a cumulative delay constituting the sum of the delays in the different delay elements and corresponding to the delay indicated by the binary signals.

15 Claims, 6 Drawing Sheets

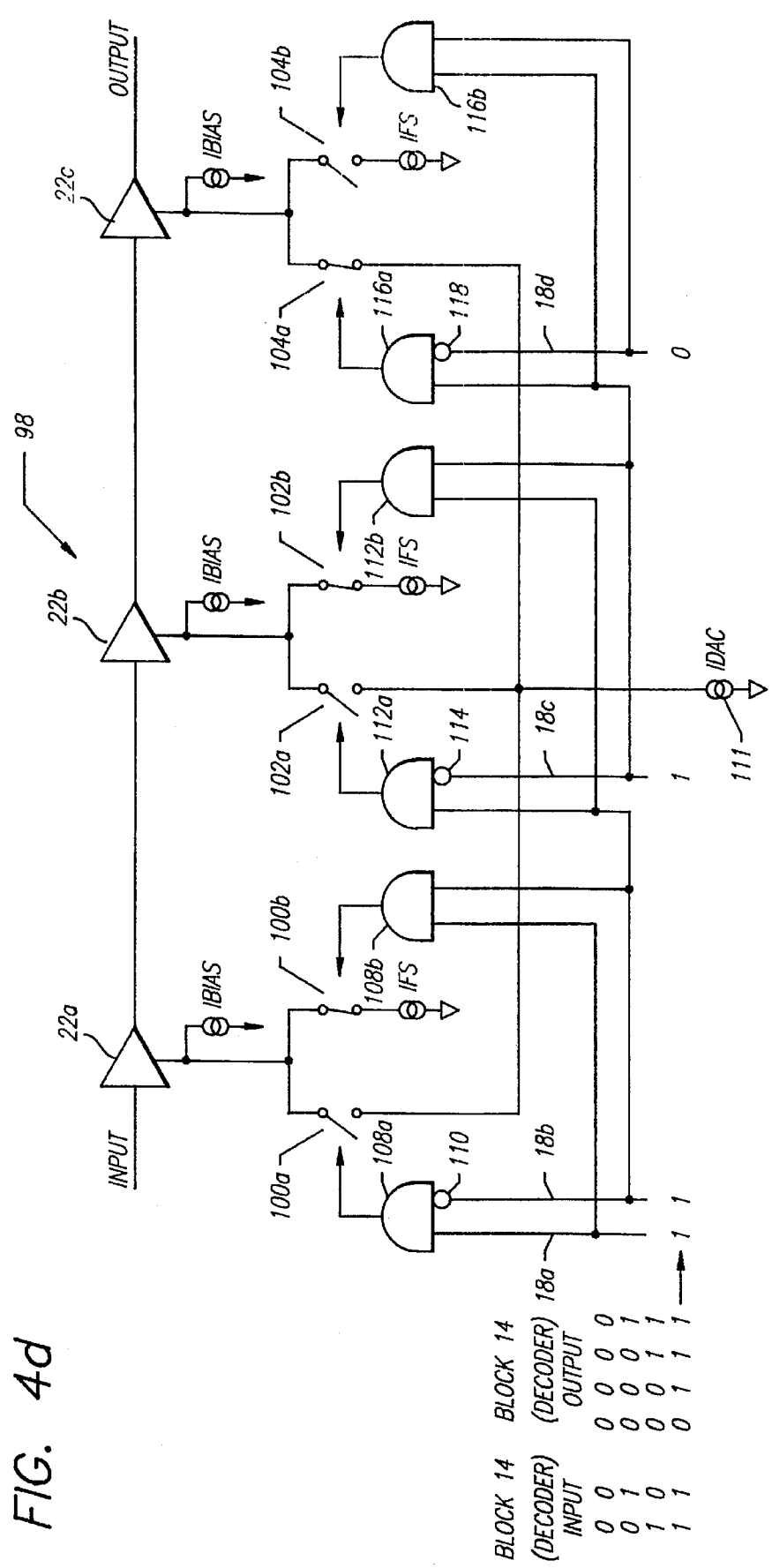

ADJUSTABLE DELAY LINE

This is a continuation of application Ser. No. 08/382,677 filed Feb. 2, 1995, now U.S. Pat. No. 5,554,950, is a continuation application Ser. No. 08/011,205 filed Jan. 29, 1993, now abandoned, which in turn is a continuation-in-part of application Ser. No. 07/830,595 filed Feb. 4, 1992, now abandoned.

This invention relates to apparatus for, and a method of, providing an adjustable delay. More particularly, the invention relates to an apparatus for, and a method of, providing an adjustable delay instantaneously and with low differential and integral errors.

BACKGROUND OF THE INVENTION

As processes of fabricating semi-conductor chips have become progressively sophisticated, the sizes of semi-conductor chips have decreased. For example, processes are now in use where the thicknesses of wires in semi-conductor circuits are less than one micron (1 μ). This has allowed the number of semi-conductors on a chip to increase so that tens of thousands of transistors exist on a rectangular chip with dimensions of approximately one quarter of an inch (¼) on each side.

Because of the resultant increase in complexity in the circuitry on the chip, the number of external connections to the electrical circuitry on semi-conductor chips has increased as the micron size of the wires on the chips has decreased. With micron sizes of one micron (1 μ) or less, hundred of pads are now often disposed on the periphery of the chips to provide connections to apparatus external to the chips.

The frequencies of the electrical circuitry on the chips have also increased as the micron size of the wires on the chips has decreased. For example, where just a few years ago, frequencies in excess of fifty megahertz (50 mHz) were considered to be unattainable for micron sizes of approximately two microns (2 μ) in CMOS technology, frequencies in the hundreds of millions of megahertz are now attainable with micron sizes of approximately eight tenths of a micron (0.8 μ) in such technology.

As the frequencies of the circuitry on a chip have increased and the number of pads on the chip for connections to apparatus external to the chip have increased, it has become increasingly difficult to provide equipment for testing the chip. This has been particularly true when it has been desired to test the chips on an automatic basis with a minimal error and in a minimal time. By "automatic", it is meant that the chip is disposed in the test equipment and all of the tests are performed without human intervention after the test equipment is activated. The tests have be performed in a minimal time since the test equipment is quite expensive and tens of thousands of chips of a particular model or design are often produced.

As will be appreciated, it is often at least as difficult to provide satisfactory test equipment as it is to design semi-conductor chips. After all, the circuitry on the test equipments have to operate at least at the highest frequency attainable by the circuitry on the semi-conductor chips in order for the semi-conductor chips to be tested under operative conditions. Furthermore, the test equipment has to be able to establish electrical continuity with the individual pads on the semi-conductor chips while maintaining electrical isolation between adjacent pads on the chips.

There are two (2) types of test equipment now in use. In one type of test equipment, the same circuitry is used to make individual tests on different parts of the semi-conductor chip. Delays have accordingly to be provided in the operation of the test circuitry so that the individual tests on the different parts of the semi-conductor chip can be performed in sequence. This type of test equipment has been primarily used in the past and is still in use to a considerable extent.

In the other type of test equipment, each part of the semi-conductor chip is tested by different circuitry. The use of this type of test equipment is increasing. This type of test equipment is disadvantageous in that it is relatively expensive. However, the tests are performed in a minimal amount of time since all of the tests are performed simultaneously.

In both types of test equipment, delays have to be provided in the operation of the test circuitry in order to perform the tests satisfactorily. The delays are provided to determine if the circuitry on the chip being tested meets performance criteria specified for such circuitry. The delays have to be provided "on the fly". In other words, the delay element has to provide a uniquely programmed delay value for each input pulse. This requires the delay element to change its delay value at the same frequency as the input pulse frequency. The delays have to be precise in order to assure that the tests of the circuitry on the semi-conductor chip are performed satisfactorily and reliably under actual operating conditions.

Delay elements have generally been operated until now on an analog basis. In other words, analog signals have been introduced to the delay element to produce delays dependent upon the magnitude of the analog signals. As will be appreciated, the delays have not been precise. This has resulted from the fact that analog signals are not precise and that responses on an analog basis in delay elements to imprecise analog signals have been even less precise. For example, a change from a value of "67" to a value of "68" on an analog basis is not precise and the change in response of a delay element from an imprecise analog value of "67" to an imprecise analog value of "68" has been even less precise.

It has been appreciated for some time that delays obtained from analog signals have been less precise than would ordinarily be desired. A considerable effort has been made to provide delay systems which overcome the disadvantages specified above. For example, an approach has been tried in which a gate is used as the basic delay element. Delay variations on the gate are obtained by adjusting the load on the gate. By this approach, it is possible to provide a family of gates each with a slightly greater gate propagation delay than the previous gates in the family. Once the gates have been designed, the delay values in the gates can be binarily weighted. Then a multiplexing scheme can select the appropriate tap locations to pick off the delayed signal. The problem with this approach is its inherent non-monotonicity. This approach requires binarily weighted gate delays and tap multiplexing to provide delay matching to better than the resolution of the delay element. This could require gate delay matching within picoseconds. Furthermore, since a calibration scheme is required, this approach requires a large size and further requires a cost overhead attributable to the time involved in calibration.

SUMMARY OF THE INVENTION

This invention involves a system for, and a method of, providing an adjustable delay by using digital techniques. The system and method of this invention provide a linear control to produce a monotonic delay. By "monotonic" is meant that digital information of progressively increasing value is converted to delay information of progressively increasing value without any decrease in the delay values as the digital values progressively increase. The system and method of this invention provide minimal differential and integral linearity error. By minimal error in differential linearity is meant that the error in delay values is relatively low over a narrow range of delay values. By minimal error in integral linearity is meant that the error over wide ranges of the delay values is relatively low.

The system and method of this invention also have other important advantages. The system and method provide reliable delays in response to digital input signal in less than one clock cycle even at frequencies in the hundreds of megahertz for CMOS inputs and even when the delay varies between successive clock cycles (i.e. on the fly). Furthermore, the system and method of this invention provide reliable delays even when subjected to noise such as from power supply lines and from coupling of noise into signal lines.

In one embodiment of the invention, a plurality of binary signals are provided each having first and second logic levels respectively representing a binary "1" and a binary "0" and each indicating a binary digit of an individual binary significance. These signals cumulatively represent an adjustable delay to be provided by a plurality of delay elements. A first particular number of the binary signals of greatest binary significance are decoded to provide, in a thermometer code, a plurality of signals each having first and second amplitudes. The signals in the thermometer code control the operation of individual switches each having a first operative relationship to provide for a maximum delay in an associated one of the delay elements and each having a second operative relationship to provide for a minimum delay in such delay element.

The binary signals of least binary significance are decoded to produce an analog signal variable between the first and second amplitudes in accordance with the decoded value of such binary signals. The analog signal is introduced, in a third operative relationship of an individual one of the switches, to the delay element associated with such switch to provide a delay variable between the minimum and maximum values in accordance with the amplitude of the analog signal. The selection of the individual one of the switches is dependent upon the pattern of the binary signals in the thermometer code, this pattern being a binary 10 in a successive pair of the decoded binary signals. The delay elements may be connected in series to provide a cumulative delay constituting the sum of the delays in the different delay elements and corresponding to the delay indicated by the binary signals.

BRIEF DESCRIPTION OF THE DRAWINGS

FIGS. 4a–4d are circuit diagrams which are used in conjunction with the embodiment shown in FIG. 1, these circuit diagrams showing the same circuit with progressive thermometer values introduced to the circuit.

DESCRIPTION OF THE PREFERRED EMBODIMENTS

Figure 1:
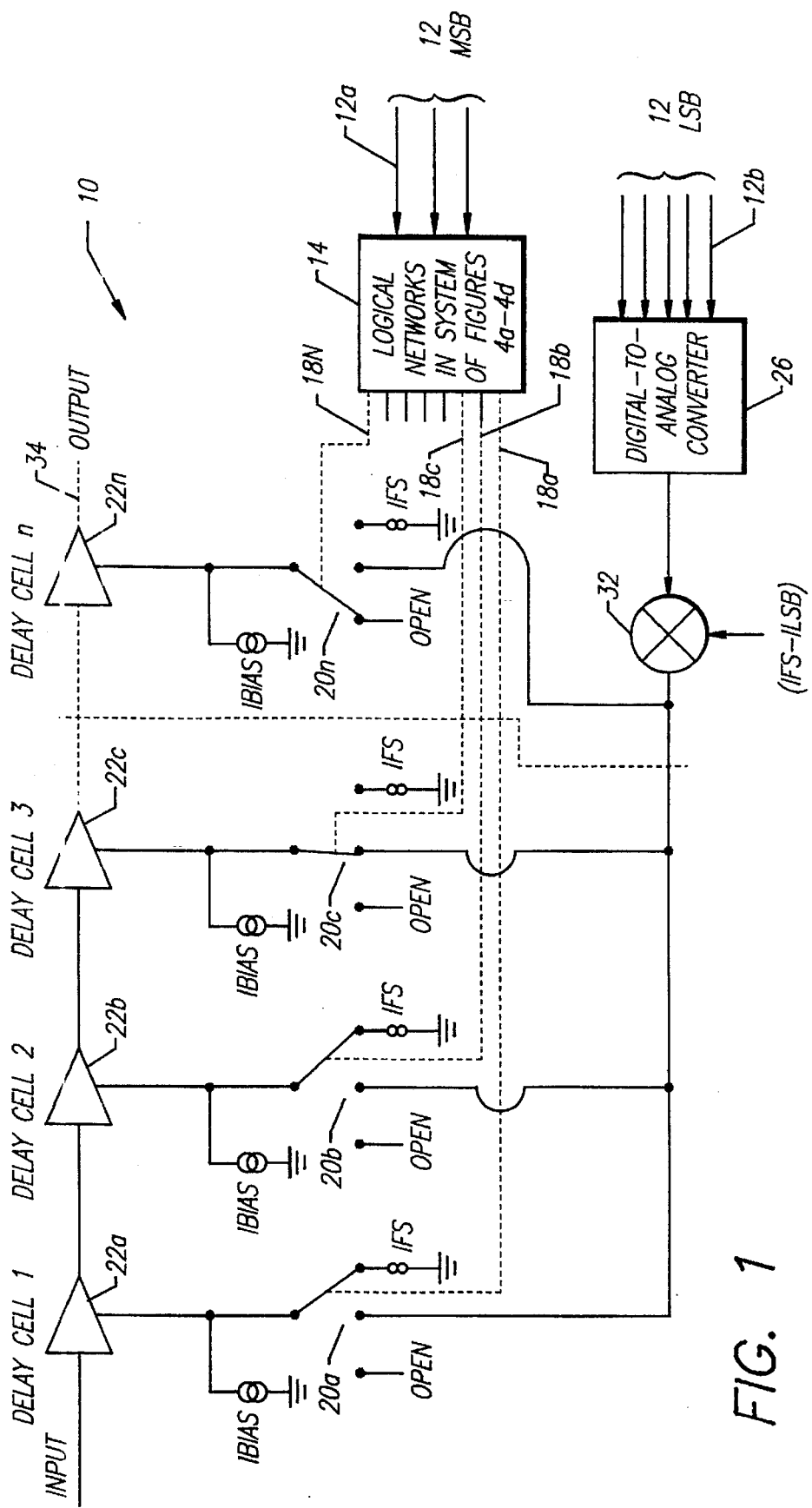
FIG. 1 is a schematic circuit diagram, partly in block form, of one embodiment of an invention for providing an adjustable delay, the invention including a plurality of delay elements for providing a digital adjustment in the delay.

In one embodiment of the invention, a system is generally indicated at 10 (FIG. 1) for operating on a digital basis to produce an adjustable delay. The system includes a plurality of lines 12 each providing signals having first and second logic levels respectively representing a binary "1" or a binary "0" and each representing a binary bit of an individual binary significance. For example, a line 12a provides a binary signal of highest binary significance and a line 12b provides a binary signal of lowest binary significance. Cumulatively, the signals on the lines 12 represent in digital form the adjustable delay to be provided by the system shown in FIG. 1. Eight (8) lines 12 are illustratively shown in FIG. 1 but any number of elements may be used.

The signals on the lines 12 of greatest binary significance provide a coarse control. The signals on these lines are introduced to a block 14. This block 14 provides a simplified illustration of the logical network in the system of FIGS. 4a–4d. For example, the signals on the three (3) lines (including the line 12a) of greatest binary significance may be introduced to the block 14. However, it will be understood that the signals on any specified number of the lines 12 may be introduced to the block 14.

The block 14 operates to convert the signals in the binary code into signals in a thermometer code which is well known in the art. These signals are produced on lines 18 which are respectively designated in FIG. 1 and in FIGS. 4a–4d as 18a, 18b, 18c, etc. For example, when the block 14 receives the signals on the three (3) lines 12 of greatest binary significance, the block 14 produces signals on eight (8) output lines. The signals introduced to the block 14 may be seen from the following table:

| Logic Level of Binary Signal of Greatest Binary Significance | Logic Level of Binary Signal of Next Greatest Binary Significance | Logic Level of Binary Signal Third Greatest Binary Significance | Integer Value In Thermometer Code |
| --- | --- | --- | --- |
| 0 | 0 | 0 | 1 |
| 0 | 0 | 1 | 2 |
| 0 | 1 | 0 | 3 |
| 0 | 1 | 1 | 4 |
| 1 | 0 | 0 | 5 |
| 1 | 0 | 1 | 6 |
| 1 | 1 | 0 | 7 |
| 1 | 1 | 1 | 8 |

The binary signals on the line 12 representing the three most significant binary bits are converted to output signals on the lines 18 (e.g. 18a, 18b, 18c, etc.) in a thermometer code. When the signals representing the three most significant binary bits are converted to the thermometer code, eight (8) output lines 18a, 18b, etc. are provided. For example, when the pattern of the signals on the three (3) lines 12 of highest binary significance is 011, a signal is produced on the line 18c (the third one of the lines 18) to indicate the Arabian integer "3" and a binary "0" is produced on the lines 18d, 18e, etc.

The eight (8) output lines 18a, 18b, 18c, etc. may have a thermometer code as follows for the successive integers between "1" and "8".

| Integer | Line 18h | Line 18g | Line 18f | Line 18e | Line 18d | Line 18c | Line 18b | Line 18a |
| --- | --- | --- | --- | --- | --- | --- | --- | --- |
| 1 | 0 | 0 | 0 | 0 | 0 | 0 | 0 | 1 |
| 2 | 0 | 0 | 0 | 0 | 0 | 0 | 1 | 1 |
| 3 | 0 | 0 | 0 | 0 | 0 | 1 | 1 | 1 |
| 4 | 0 | 0 | 0 | 0 | 1 | 1 | 1 | 1 |
| 5 | 0 | 0 | 0 | 1 | 1 | 1 | 1 | 1 |
| 6 | 0 | 0 | 1 | 1 | 1 | 1 | 1 | 1 |
| 7 | 0 | 1 | 1 | 1 | 1 | 1 | 1 | 1 |
| 8 | 1 | 1 | 1 | 1 | 1 | 1 | 1 | 1 |

The block 14 controls the operation of switches 20a, 20b, etc. The switches 20a, 20b and 20c respectively correspond to the switches 100a and 100b, the switches 102a and 102b and the switches 104a and 104b in FIGS. 4a–4b. When eight (8) outputs from the block 14 are provided, eight (8) switches 20 are provided each associated with a different one of the outputs. Thus, the switches 20a, 20b, etc. are respectively associated with the block 14. Each of the switches 20a, 20b, etc. is shown for purposes of illustration as a mechanical switch having a movable arm and having three (3) stationary terminals each disposed to establish an electrical continuity with the movable arm of the switch in one of the three (3) positions to which the movable arm is actuated. However, it will be appreciated that each of the switches 20 may be formed from transistors or other types of electrical elements or from groups of transistors or such other electrical elements. The switches 20 may be operated by the logical networks shown in FIGS. 4a–4d.

The movable arm of each of the switches 20 is connected to an individual one of delay elements or cells 22. For example the movable arms of the switches 20a and 20b are respectively connected to delay lines or cells 22a and 22b. Each of the delay elements or cells 22 is constructed to provide a variable delay dependent upon the magnitude of the signal introduced to the delay elements or cell. The delay elements 22 are constructed to respond to changes in the signals introduced to the delay elements such that the relationship between the signal magnitude and the delay is substantially linear. The signal may be either a variable current or a variable voltage without departing from the scope of the invention. However, each of the delay elements 22 in FIG. 1 is shown as being responsive to a variable current. Delay elements 22 of the type described above are well known in the art.

Each of the delay elements 22 in FIG. 1 is shown as receiving a constant current, designated as "IBIAS", from a source. The constant current "IBIAS" introduces a minimum current to each of the delay elements 22 to produce a minimum delay in the delay element regardless of the operation in the first, second or third relationships of the switch associated with such delay element. The time of this minimum delay may be designated as tmin. This constant minimum delay current is provided even when the switch 20 is in the first relationship in which an open circuit is produced through the switch. This first operative relationship of each switch 20 is designated in FIG. 1 as "OPEN".

The third operative relationship of each of the switches 20 is designated as "IFS" (meaning "full scale current"). In this relationship, a constant current IFS from a source is introduced through each individual one of the switches 20 to the associated one of the delay elements 22. This constant current produces a maximum delay through the associated delay element 22. The time of this maximum delay through each of the delay elements 22 is designated as "tmax".

The block 14 is constructed to introduce a first signal to each of the delay elements 22 higher in the sequence than the individual one of the delay elements selected by the block. For example, when the third delay element is selected from the eight (8) delay elements 22 provided for the three binary bits of highest binary significance, the first (1st) and second (2nd) delay elements are provided with the maximum current IFS as a result of the operation of the block 14 in providing the first (1st) and second (2nd) switches 20 in the third operative relationship.

In like manner, the block 14 operates the fourth (4th) through eighth (8th) switches 20 in the first operative relationship in the example of the previous paragraph to produce the minimum current IBIAS in each of the fourth (4th) through eighth (8th) delay elements. The operation of the block 14 in this manner may be seen from FIGS. 1–3 of U.S. Pat. No. 4,794,282 issued to Joseph Colles on Dec. 27, 1988, for "TTL to CMOS Voltage Level Transistor" and assigned of record to the assignee of record of this application.

The signals on the five (5) lines 12 of least binary significance provide a fine control. The signals on these lines. are introduced to a digital-to-analog converter 26 which may be constructed in a conventional manner. Since the converter 26 is responsive to five (5) binary bits and since $2^5 = 31$, the converter 26 produces values between "0" and "31". The output from the converter 26 controls the introduction of a portion of the maximum current IFS from a multiplier 32 to the individual one of the delay elements 22. In the example given above, the individual one of the delay elements may be the third (3rd) delay element 22c. The current from the multiplier 32 is able to flow to the individual one of the delay elements 22 because the switch 20 associated with that delay element is in the second operative relationship. When the converter 26 provides a value of "31", 31/32 of the maximum current IFS flows through the individual one of the switches 20 (in the second operative relationship of the switch) to the associated delay element 22. This current produces 31/32 of the maximum delay tmax in the associated delay element 22.

The delay elements or cells 22 are connected in series. This means that the output from a line 34 connected to the last of the delay elements 22 in the series is an accumulation of the delays provided by each of the delay elements or cells in the series. Thus, the output on the line 34 constitutes a sum of the delays tmin where the switches 20 are in the first operative relationship, the delays tmax where the switches 20 are in the third operative relationship and the time delay in the individual one of the delay elements 22 where the associated switch 20 is in the second operative relationship. Since the delay range in a single one of the delay elements 22 is tr = tmax-tmin, the delay range in the string of n delay elements 22 is TR=Tmax - Tmin=n, (tmax-tmin). Since eight (8) delay elements are provided in the example given above to correspond to the decoding of the three most significant binary signals on the lines 12, n=8 in this example.

Figure 2:
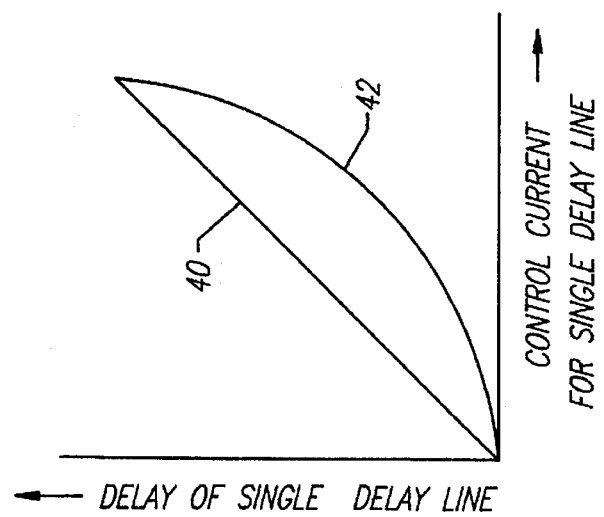
FIG. 2 is a schematic diagram illustrating the ideal response of each of the delay elements through the range of delays provided by such delay element and further illustrating the actual response provided by such delay element through such range of delays.

FIG. 2 schematically illustrates the error in a single one of the delay elements or cells 22 as the delay in the delay element varies between tmin and tmax. In FIG. 2, the current flowing through the delay element 22 to produce the delay in the delay element is indicated along the horizontal axis. The resultant delay produced by this current is indicated along the vertical axis. In FIG. 2, an ideal response is indicated at 40. As will be seen, the ideal delay provided by the ideal delay element or cell varies. linearly between tmin and tmax as the current through the delay element or cell varies linearly.

FIG. 2 also illustrates schematically at 42 the actual delay in the individual one of the delay elements or cells 22 with variations in the current in the delay element or cell. As will be seen, there is a deviation in such a delay element or cell from a linear relationship. This deviation represents an error in the response of the delay element. The deviation from an ideal response in the delay provided by the delay element 22 to variations in the current through the delay element is magnified in FIG. 2 for illustrative purposes.

Figure 3:
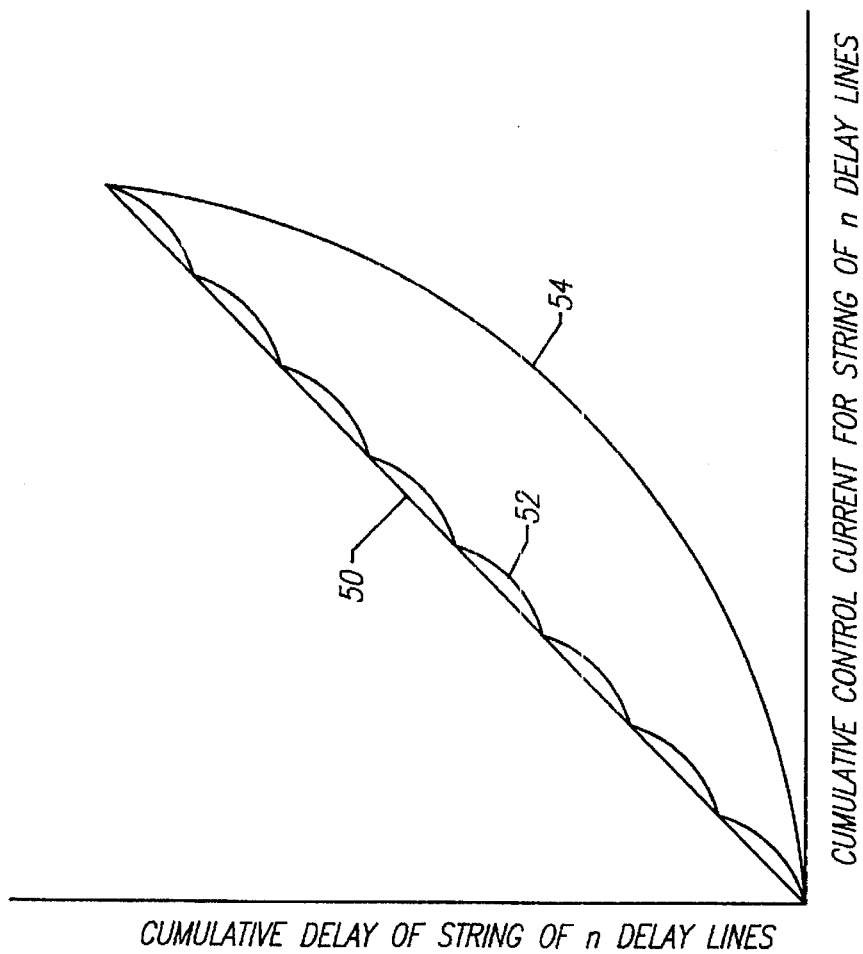
FIG. 3 is a schematic diagram illustrating (a) the ideal response provided by all of the delay elements shown in FIG. 1 through the cumulative range of delays provided by such delay elements, (b) the actual response provided by all of such delay elements through such cumulative range of delays; and (c) the response provided by the analog systems of the prior art through such cumulative range of delays.

FIG. 3 illustrates the cumulative response to variations in current of (a) an ideal delay system, (b) of the system of this invention and (c) of a system in the prior art. In FIG. 3, the cumulative current in the system is illustrated along the horizontal axis and the cumulative delay in the system is illustrated along the vertical axis. In FIG. 3, the response of an ideal system is illustrated at 50. As will be seen, the cumulative delay in such an ideal system varies linearly with changes in the cumulative current in the system. The response of an unsegmented delay system of the prior art is illustrated at 54 in FIG. 3. The cumulative response of the segmented system of this invention is illustrated at 52 in FIG. 3. As will be seen, the response 52 of the segmented system of this invention is considerably less than the response of the unsegmented system of the prior art. The curves 52 and 54 are illustrative only and do not represent absolute values.

The difference (or error) between 52 and 50 in FIG. 3 will be the same error as in the difference between 42 and 40 in FIG. 2. This error will be 1/n* (the error in the unsegmented example) between 54 and 50. In this example, n=8. In other words, for the unsegmented delay element the error of a string of delay elements is equal to the error of a single delay element multiplied by the number of delay elements (in this case 8). However, in the segmented case, the error of a string of delay elements is equal to the error of a single delay element. The unsegmented string of delay elements has the current control pin of each delay element hooked together. There is one current control shared for the entire string.

FIGS. 4a, 4b, 4c and 4d show one embodiment, generally indicated at 98, of the block 14 in FIG. 1 and the switches 20a, 20b, 20c and 20n for controlling the operation of individual ones of the switches in individual ones of the first, second and third positions of such switches in accordance with the thermometer indications from the block 14. FIGS. 4a–4d show the same circuitry in individual states of operation. The circuitry shown in FIGS. 4a–4d has three (3) binary inputs to the decoder 14. However, only four (4) individual thermometer outputs from the electrodes are shown in FIGS. 4a–4d. It is believed that a person of ordinary skill in the art will be able to expand the operation of the circuitry to accommodate three (3) binary inputs to the block 14 and eight (8) binary outputs from the block or to expand the circuitry to any desired number of inputs and a number of outputs dependent upon the number of such inputs.

The circuitry shown in FIGS. 4a–4d includes pairs of switches 100a and 100b, 102a and 102b and 104a and 104b. The switches are shown for purposes of illustration as mechanically operated single-pole single-throw switches but it will be appreciated that the switches may actually constitute transistors or may have other forms. As will be appreciated from the subsequent discussion, the switches 100a and 100b are functionally equivalent to the switch 20a in FIG. 1. Similarly, the switches, 102a and 102b and the switches 104a and 104b are respectively equivalent functionally to the switches 20b and 20c in FIG. 1.

A logical network such as an AND gate is associated with each one of the switches 100a and 100b, 102a and 102b and 104a and 104b. For example, an AND network 108a is associated with the switch 100a and an AND network 108b is associated with the switch 100b. The logical network 108a receives an input from the line 18a and an inverted input from the line 18b, the inversion being provided by an inverter 110. The inputs on the lines 18a and 18b are directly introduced to the AND network 108b. The stationary contact of the switch 100a is common with a source 111 of alternating voltage designated as "IDAC". The voltage IDAC corresponds to the voltage from the multiplexer 32 in FIG. 1. The stationary contact of the switch 100b is common with the IFS voltage source.

In like manner, AND networks 112a and 112b are respectively associated with the switches 102a and 102b. The AND network 112a receives the indications from the lines 18b and 18c but the indications on the line 18c are inverted by an inverter 114 before they are introduced to the AND network. The indications from the lines 18b and 18c pass directly to the AND network 112b. The stationary contact of the switch 102a is common with the IDAC voltage source 110 and the stationary contact of the switch 102b has a common connection with the IFS voltage source.

Similarly, AND networks 116a and 116b are respectively associated with the switches 104a and 104b. The AND network 116a receives the binary indications on the lines 18c and 18d, the indications on the line 18d being inverted by an inverter 118 before being introduced to the AND network. The indications on the lines 18c and 18d are introduced directly to the AND network 18b. The stationary contact of the switch 104a has a common connection with the IDAC voltage source 110 and the stationary contact of the switch 104a is common with the IFS voltage source.

FIGS. 4a–4d also include two charts at the left ends of these Figures. One chart is designated as "BLOCK 14". It indicates the inputs on the two lines of least binary significance in the most significant bits, these bits being designated as "MSB" in FIG. 1. One of these lines is the line 12a in FIG. 1. The other chart is designated as "BLOCK 14". It indicates the thermometer output from the block 14 for each block input. The thermometer outputs are obtained from the lines 18 in FIG. 1.

A line with an arrow at the right is positioned in each of FIGS. 4a–4d adjacent the "BLOCK 14" chart to indicate the column from which the inputs to the circuit shown in the individual ones of FIGS. 4a–4d are taken. For example, the arrow in FIG. 4b indicates that the inputs to the circuit are taken from the second column in the chart designated as "BLOCK 14 OUTPUT". These inputs have a pattern of 01 where the least significant bit is at the right in the chart.

Figure 4A:
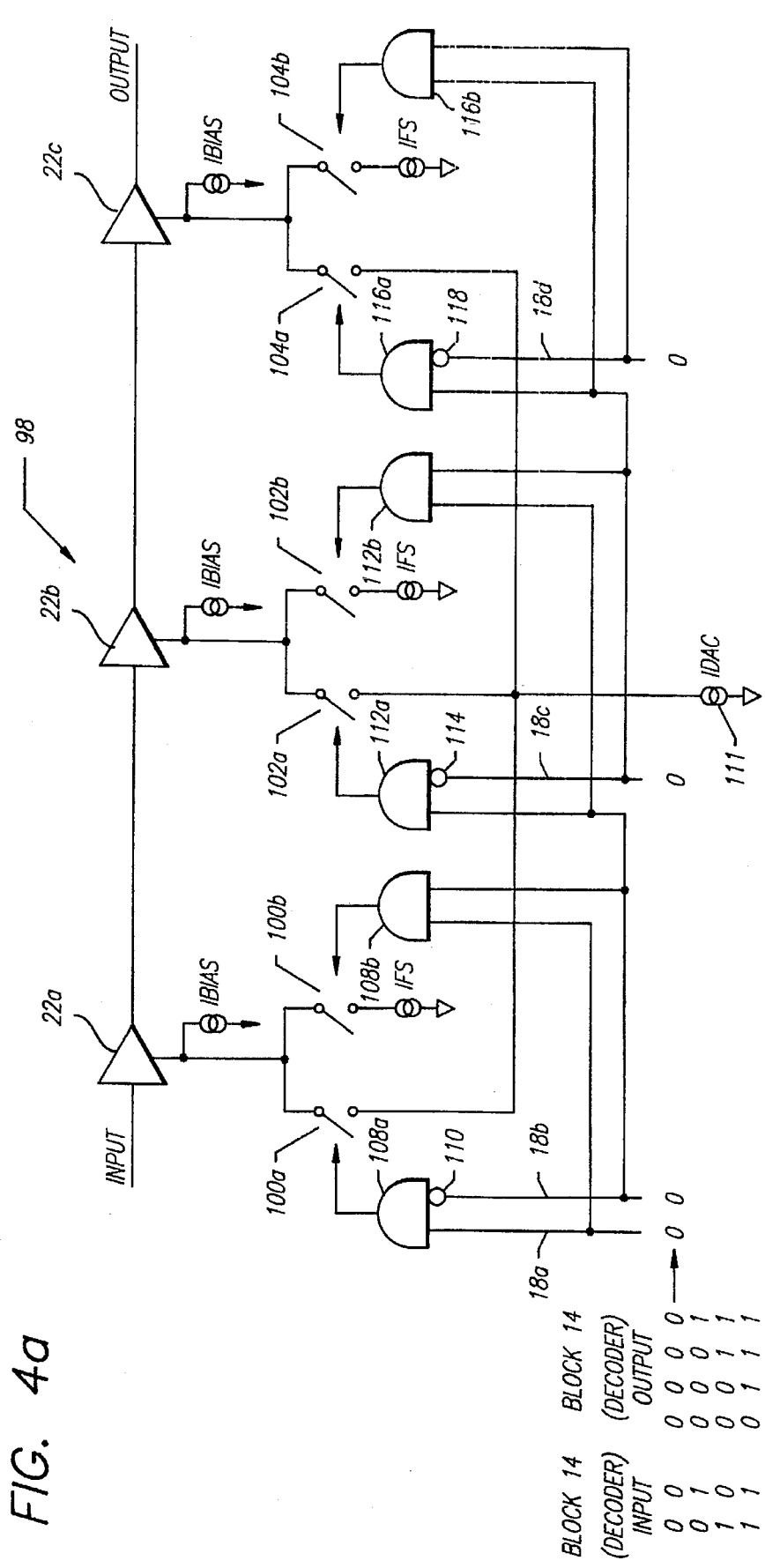

When the output from the block 14 has a binary pattern of 00 on the lines 18a and 18b, none of the AND networks in FIG. 4a passes a signal. This results from the fact that each of the AND networks passes a signal only when both inputs to such AND network are a binary 1. Thus, the AND networks do not pass a signal because of the introduction of a binary 0 to at least one of the inputs to each of the AND networks 108b, 112b and 116b. Because of this, none of the switches in FIG. 4a is operated to a closed state.

Figure 4B:
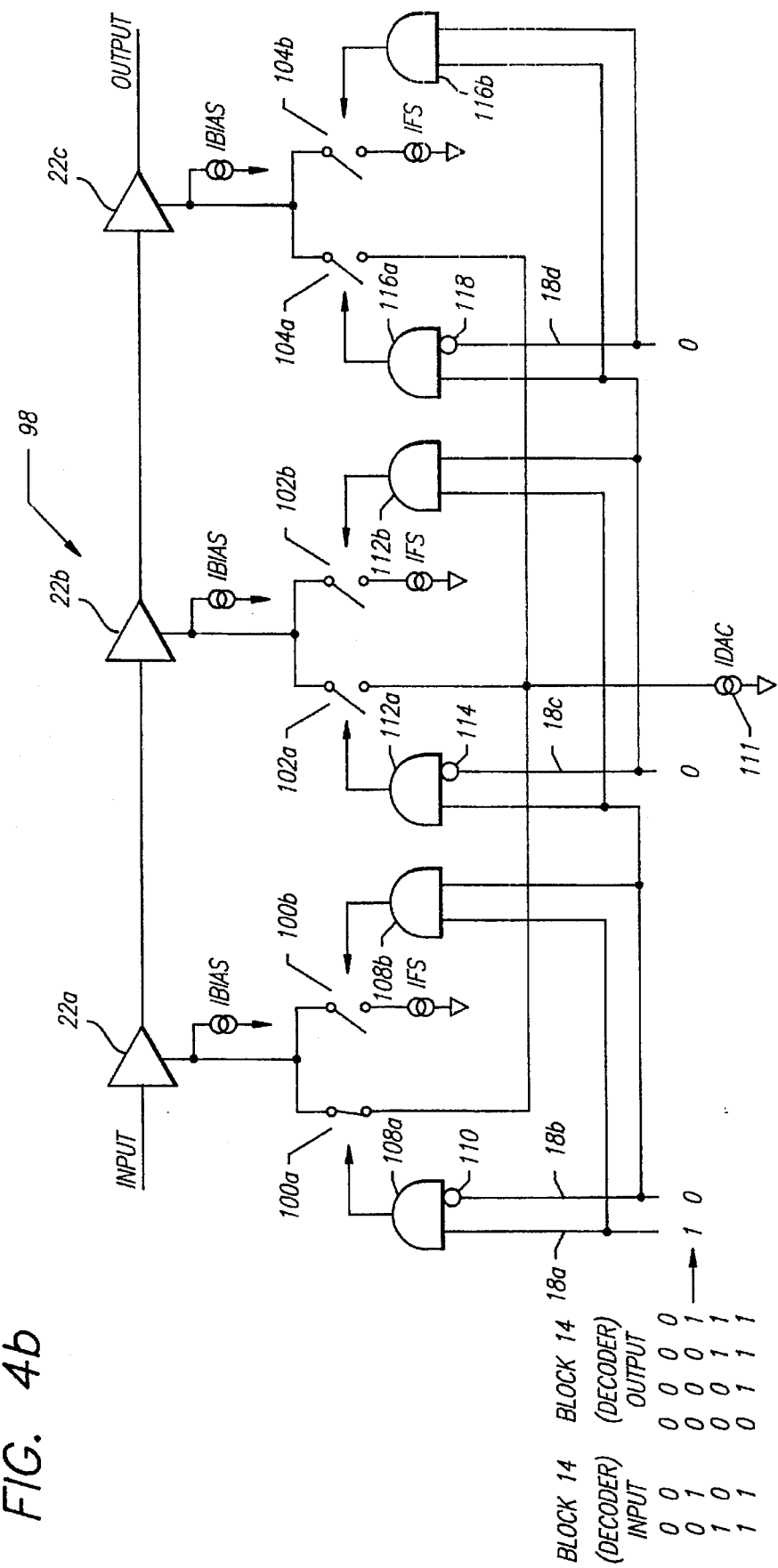

In FIG. 4b, the pattern of the binary signals introduced to the AND networks 108a and 108b is 01 where the least significant signal is at the right. These signals are respectively produced on the lines 18a and 18b from the decoder 14. However, the 0 signal on the line 18b is inverted by the inverter 110 so that the pattern of the signals introduced to the AND network 108a is 11. This causes the AND network 108a to pass a signal to the switch 100a to close the switch. The voltage from the IDAC source 111 accordingly passes through the switch 102a to the delay cell 22a (also shown in FIG. 1). As previously indicated, this voltage corresponds to the voltage from the multiplier 32 in FIG. 1.

Figure 4C:
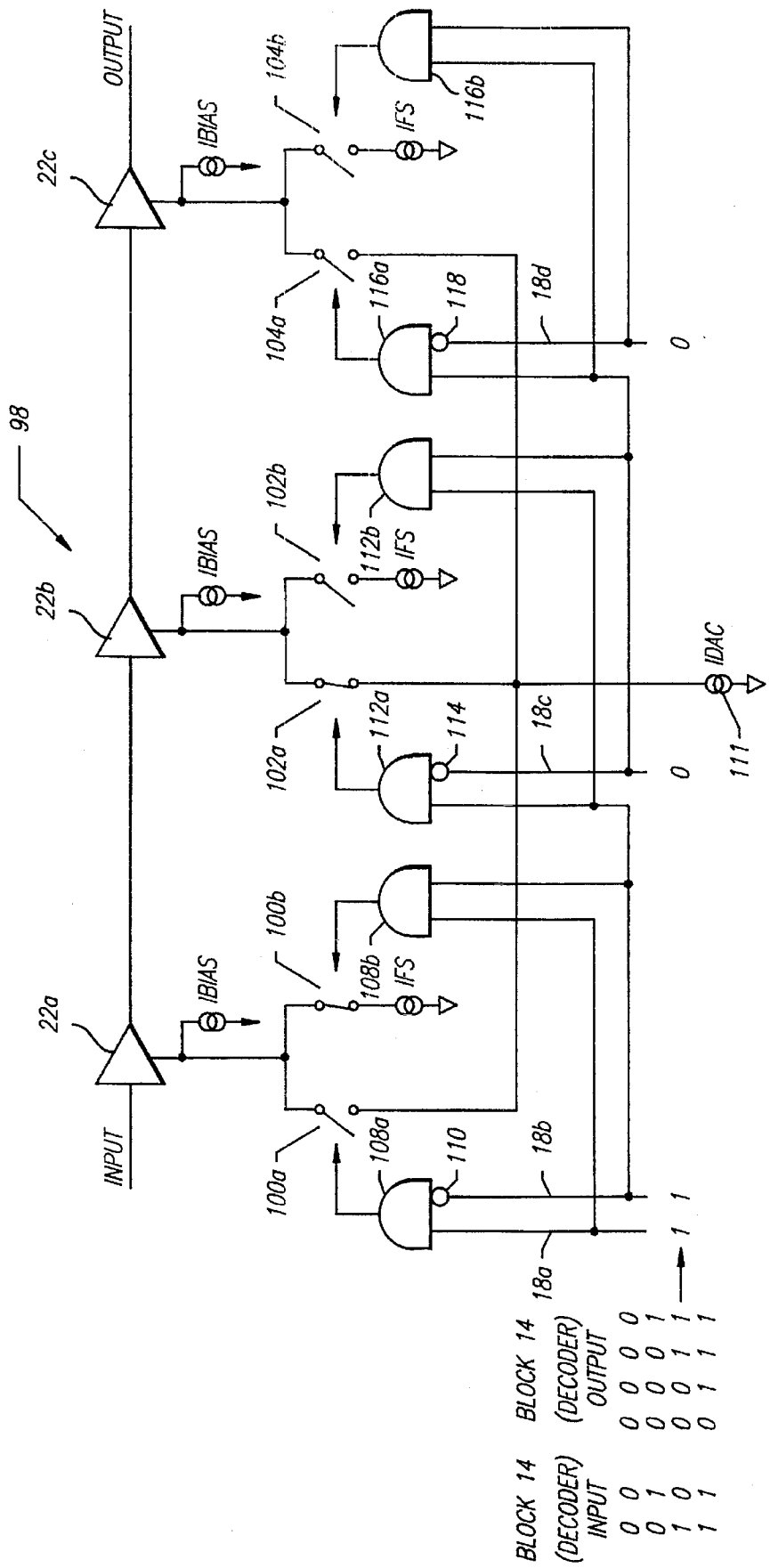

In FIG. 4c, the binary pattern of 11 on the lines 18a and 18b from the decoder 14 cause a signal to pass through the AND network 108b. This causes the switch 100b to close so that the IFS voltage is introduced to the delay element 22a. At the same time, the binary signals on the lines 18b and 18c are introduced to the AND network 112a. These signals have a binary pattern of 01 as shown in the BLOCK 14 OUTPUT chart in FIG. 4c, the least bit being at the right in FIG. 4c. This binary bit of 0 is shown in FIG. 4c as being introduced to the inverter 114. The resultant inversion of this binary bit causes the AND network 112a to receive a binary pattern of 11 so that the AND network passes a signal. This signal produces a closure of the switch 102a. The IDAC voltage from the voltage source 111 is accordingly introduced to the delay element 22b.

In FIG. 4d, a binary pattern of 11 on the lines 18b and 18c is introduced to the AND network 112b. This causes the switch 102b to close and the IFS voltage to be introduced to the delay element 22b. At the same time, a binary pattern of 01 is produced on the lines 18c and 18d, the least significant bit being at the right. This is indicated in the fourth column of the DECODER OUTPUT chart in FIG. 4d. The 0 bit in this pattern is inverted by the inverter 118 to a binary 1. The resultant binary pattern of 11 introduced to the AND network 116a causes the switch 104a to close and the IDAC voltage from the source 111 to be introduced to the delay element 22c.

The segmented approach in the system of this invention lends itself to good differential linearity. Assuming that the current source matching is ideal, monotonicity is assured. Each of the delay elements 22 is constructed so that it always increases the delay as a function of increases in current through the delay element as the operative relationship of the associated switch 20 changes from the first operative relationship (IBIAS) to the second operative relationship (IDAC) and then to the third operative relationship (IFS). Furthermore, each of the delay elements 22 is constructed so that the IFS current is greater than the maximum current through the multiplier 32. Under such circumstances, each of the delay elements 22 provides a monotonicity and the string of the delay elements 22 in the series relationship also provides a monotonicity.

The segmented system of this invention also provides a good response time. This results from the fact that the system is able to respond in a single clock cycle. For example, even if the clock rate is as high as two hundred megahertz (200 mHz) in bipolar circuitry, the segmented system of this invention is able to respond in less than two and one half nanoseconds (2.5 ns) to provide the proper delay at the output element 34.

The segmented system 10 of this invention can also be constructed in a relatively small area on an integrated circuit chip. This advantage results from the separation of the binary signals of greatest binary significance and the binary signals of least binary significance. For example, when the eight (8) lines 12 are separated into three (3) lines of greatest binary significance for controlling the selection of the eight (8) delay elements 22 and into the five (5) elements for controlling the operation of the converter 32 in FIG. 1, the space occupied by the converter is one eighth (⅛) of the space which is occupied by a converter, such as the converters of the prior art, in which all eight (8) lines are involved in the conversion. This results from the fact that one eighth (⅛) the number of transistors is required for a five (5) bit conversion in comparison to the number of transistors required for an eight (8) bit conversion.

The segmented delay system 10 of this invention also has other advantages. It consumes a relatively low amount of power. This results in part from the fact that the segmented approach :in this invention causes a considerably decreased number of transistors to be used in the system in comparison to the systems of the prior art. This may be seen from the discussion in the previous paragraph.

There is another advantage when the segmented system of this invention is operating "on the fly". In this system, a new pulse enters into the string of delay elements 22 and receives a delay value before the previous pulse has output from the string. This condition can occur as long as the converter (DAC) 32 has enough time to provide for the passage of the first pulse from its cell location and for the reassignment to the next cell position. This cannot be achieved in the non-segmented systems of the prior art since the digital-to-analog converter in such systems cannot change its output value until the input pulse has reached the output of the delay elements.

The delay system 10 of this invention is also advantageous in that it is insensitive to a noisy environment. This noisy environment is generated on the chip incorporating the system 10. This noise appears on the ground and power supply lines. The noise is also coupled into the signal lines.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for providing an adjustable delay in an input signal, first means for providing a plurality of binary signals of progressive binary significance to indicate the adjustable delay in the input signal, a plurality of delay elements each operative to provide a delay between minimum and maximum values, the delay elements in the plurality being connected to provide a delay related to the accumulation of the delays provided by the individual ones of the delay elements in the plurality, and second means responsive to the binary signals for simultaneously producing the maximum delay in first ones, and at times simultaneously at least one additional one (1) dependent upon the pattern of the binary signals of the progressive binary significance in the plurality, of the delay elements in the plurality and the minimum delay in second ones of the delay elements in the plurality and for producing, in a third one of the delay elements in the plurality, a delay, simultaneously with the delays produced in the first and second ones of the delay elements in the plurality, between the minimum and maximum values to provide cumulatively the adjustable delay in the input signal in the delay elements in the plurality.

2. In a combination as set forth in claim 1 wherein
the delay elements in the plurality have substantially identical characteristics and are connected in series, the third one of the delay elements being the only delay element providing in the plurality at each instant the delay between the minimum and maximum values.

3. In a combination as set forth in claim 1 wherein
each of the delay elements has characteristics of producing a current between minimum and maximum limits and of providing a delay proportional to such current and wherein the second means is responsive to the binary signals in the plurality for producing the maximum current in the first ones of the delay elements and the minimum current in the second ones of the delay elements and the current between the minimum and maximum limits in the third one of the delay elements to provide the adjustable delay in the input signal cumulatively in the delay elements in the plurality.

4. In a combination as set forth in claim 3 wherein
the delay elements in the plurality have substantially identical characteristics and are connected in series and wherein the first ones of the delay elements are responsive to the values of the binary signals greater than the value to which the third one of the delay elements in the series relationship responds and wherein the second ones of the delay elements are responsive to the values of the binary signals less than the value to which the third one of the delay element in the series relationship responds, and wherein the third one of the delay elements in the plurality is the only delay line at each instant providing the delay between the minimum and maximum values.

5. In combination for providing an adjustable delay in an input signal, first means for providing a plurality of binary signals of progressive binary significance to indicate the adjustable delay in the input signal, a plurality of delay elements each having characteristics of producing a current between minimum and maximum limits and of producing a variable delay between the minimum and maximum limits dependent upon variations in the magnitude of the current in such delay element between the minimum and maximum limits, the delay elements in the plurality being connected to provide an accumulation of the delays in the individual ones of the delay elements in the plurality, and second means responsive to the binary signals for producing the maximum current in first ones, and at times simultaneously at least one additional one (1) depending upon the pattern of the binary signals of the progressive binary significance in the plurality, of the delay elements in the plurality and the minimum current in second ones of the delay elements in the plurality and a current between the minimum and maximum limits in a third one of the delay elements in the plurality to obtain the adjustable delay in the input signal cumulatively through the delay elements in the plurality.

6. In a combination as set forth in claim 5 wherein the second means includes third means for connecting the delay elements in a series relationship and wherein the first ones of the delay elements are responsive to the values of the binary signals greater than the value to which the third one of the delay elements in the series relationship responds and the second ones of the delay elements are responsive to the values of the binary signals less than the value to which the third one of the delay elements in the series relationship responds and wherein the third one of the delay elements is the only delay element in the plurality producing at each instant the current between the minimum and maximum limits.

7. In a combination as set forth in claim 6, further including, the second means being operative to advance the third one of the delay elements in the series relationship with progressive increases in the adjustable delay and to increase the number of the first ones of the delay elements in accordance with such advance in the third one of the delay elements and to decrease the number of the second ones of the delay elements in accordance with such advance in the third one of the delay elements.

8. In a combination as set forth in claim 7 wherein the second means includes means responsive to first ones of the binary signals in the plurality for selecting the first, second and third delay elements and including converting means responsive to second ones of the binary signals in the plurality for producing the current in the third one of the delay elements between the minimum and maximum limits.

9. In a combination as set forth in claim 8, wherein the first ones of the binary signals in the plurality have a greater binary significance than the second ones of the binary signals in the plurality.

10. In a combination as set forth in claim 5 wherein the second means simultaneously produces the maximum current in the first ones of the delay elements in the plurality, the minimum current in the second ones of the delay elements in the plurality and the current between the minimum and maximum currents in the third one of the delay elements in the plurality.

11. In combination for providing an adjustable delay in an input signal, first means for providing a plurality of binary signals of progressive binary significance to indicate the adjustable delay in the input signal, a plurality of delay elements each having characteristics of producing a variable delay between minimum and maximum limits, the delay elements in the plurality being constructed to provide an accumulation of the delays in the delay elements in the plurality, and second means responsive to first individual ones of the binary signals for determining first individual ones of the delay elements, and at times simultaneously at least one additional one (1) depending upon the pattern of the binary signals of the progressive binary significance in the plurality, to provide a delay of the maximum limit and for determining second individual ones of the delay elements to provide a delay of the minimum limit and for determining a third individual one of the delay elements to provide a variable delay between the minimum and maximum limits and responsive to second individual ones of the binary signals of a different binary significance than the first individual ones of the binary signals for determining the magnitude of the variable delay in the third individual one of the delay elements between the minimum and maximum limits.

12. In a combination as set forth in claim 11 wherein the delay elements have substantially identical characteristics and are connected in series and wherein the first individual ones of the delay elements are responsive to the values of the first individual ones of the binary signals greater than the value to which the third individual one of the delay elements in the series relationship responds and the second individual ones of the delay elements are responsive to the values of the second individual ones of the binary signals less than the value to which the third individual one of the delay elements in the series relationship responds.

13. In a combination as set forth in claim 11 wherein the second means includes means responsive to the first individual ones of the binary signals in the plurality for determining the first and second individual ones of the delay elements and the third individual one of the delay elements in the plurality and includes converter means responsive to the second individual ones of the binary signals and operative on a digital-to-analog basis for determining the magnitude of the variable delay in the third individual one of the delay elements between the minimum and maximum limits.

14. In a combination as set forth in claim 13, the delay elements have substantially identical characteristics and are connected in series and wherein the first individual ones of the delay elements are responsive to values of the binary signals greater than the value to which the third individual one of the delay elements in the series relationship responds and wherein the second individual ones of the delay elements are responsive to values of the binary signals less than the value to which the third individual one of the delay elements in the series relationship responds and wherein the number of the first individual ones of the delay elements in the series relationship increases with progressive increases in the adjustable delay and the number of the second ones of the delay lines in the series relationship decreases with progressive increases in the adjustable delay and the position of the third individual one of the delay elements in the series relationship advances with increases in the adjustable delay and wherein the third individual one of the delay elements is the only one of the delay elements at each instant providing the variable delay between the minimum and maximum limits.

15. In a combination as set forth in claim 11 wherein the second means simultaneously determines the first ones of the delay elements in the plurality to provide the delay of the maximum limit, the second ones of the delay elements in the plurality to provide the delay of the minimum limit and the third one of the delay elements in the plurality to provide the variable delay between the minimum and maximum limits.

* * * * *